(12) United States Patent
Sun et al.

(10) Patent No.: US 12,346,185 B2
(45) Date of Patent: Jul. 1, 2025

(54) MAINBOARD PROTECTION SYSTEM AND METHOD

(71) Applicant: Suzhou MetaBrain Intelligent Technology Co., Ltd., Suzhou (CN)

(72) Inventors: Hui Sun, Suzhou (CN); Yunli Liu, Suzhou (CN)

(73) Assignee: Suzhou MetaBrain Intelligent Technology Co., Ltd., Suzhou (CN)

( * ) Notice: Subject to any disclaimer, the term of this patent is extended or adjusted under 35 U.S.C. 154(b) by 0 days.

(21) Appl. No.: 18/870,940

(22) PCT Filed: Jun. 28, 2023

(86) PCT No.: PCT/CN2023/103409
§ 371 (c)(1),
(2) Date: Dec. 2, 2024

(87) PCT Pub. No.: WO2024/103745
PCT Pub. Date: May 23, 2024

(65) Prior Publication Data
US 2025/0172986 A1    May 29, 2025

(30) Foreign Application Priority Data
Nov. 16, 2022   (CN) .................. 202211430839.X

(51) Int. Cl.
*G06F 1/30*     (2006.01)
*G01R 31/52*    (2020.01)
(Continued)

(52) U.S. Cl.
CPC .............. *G06F 1/30* (2013.01); *G01R 31/52* (2020.01); *G06F 11/3058* (2013.01); *H02H 1/0007* (2013.01); *H02H 3/08* (2013.01)

(58) Field of Classification Search
CPC .... G06F 1/30; G06F 11/3058; G06F 11/3003; H02H 3/08; H02H 1/0007; G01R 31/52
See application file for complete search history.

(56) References Cited

U.S. PATENT DOCUMENTS

2020/0033926 A1* 1/2020 Maddukuri ............... G06F 1/28
2020/0220347 A1* 7/2020 Liu ............................ H02J 7/00

FOREIGN PATENT DOCUMENTS

| CN | 102882187 A | 1/2013 |
| CN | 208257396 U | 12/2018 |

(Continued)

OTHER PUBLICATIONS

International Search Report and Written Opinion of corresponding PCT Application No. PCT/CN2023/103409 mailed Sep. 14, 2023 including English translation (14 pages).

(Continued)

*Primary Examiner* — Terrell S Johnson
(74) *Attorney, Agent, or Firm* — Crowell & Moring LLP

(57) ABSTRACT

A mainboard protection system and method are provided. A precision resistor is arranged between an overcurrent protection component and a voltage regulator, and the precision resistor is connected to a current monitoring circuit. The current monitoring circuit is connected to a complex programmable logic device, and transmits, w detecting that a voltage difference of the precision resistor is greater than a set threshold, an early-warning signal to the complex programmable logic device. The complex programmable logic device is connected to a processor and sends, when receiving the early-warning signal, an interrupt signal to the processor. in response to receiving the interrupt signal, the processor cuts off outputting of the overcurrent protection component.

20 Claims, 5 Drawing Sheets

(51) Int. Cl.
  *G06F 11/30* (2006.01)
  *H02H 1/00* (2006.01)
  *H02H 3/08* (2006.01)

(56) References Cited

FOREIGN PATENT DOCUMENTS

| | | |
|---|---|---|
| CN | 109149521 A | 1/2019 |
| CN | 110502087 A | 11/2019 |
| CN | 110618743 A | 12/2019 |
| CN | 110888784 A | 3/2020 |
| CN | 112736839 A | 4/2021 |
| CN | 114816539 A | 7/2022 |
| CN | 115599193 A | 1/2023 |

OTHER PUBLICATIONS

Notification to Grant Patent Right for Invention of corresponding CN Priority Application No. CN202211430839.X dated Feb. 7, 2023, including English translation, and including English translation of allowed claims of corresponding CN Prioritx Application No. CN202211430839.X (11 pages).

\* cited by examiner

MAINBOARD PROTECTION SYSTEM AND METHOD

CROSS-REFERENCE TO RELATED APPLICATION

This application is the national phase application of International Application No. PCT/CN2023/103409, filed Jun. 28 2023, which claims priority to Chinese Patent Application No. 202211430839.X, entitled "MAINBOARD PROTECTION SYSTEM AND METHOD" and filed with the China National Intellectual Property Administration on Nov. 16, 2022. The contents of International Application No. PCT/CN2023/103409 and Chinese Patent Application No. 202211430839.X are incorporated herein by reference in their entireties.

FIELD

The present application relates to the technical field of mainboard design, and in particular, to a mainboard protection system and method.

BACKGROUND

When customers surf on the Internet, there is often a board burning problem. Although a production and processing technology for Printed Circuit Boards (PCBs) are continuously being improved at present, and people constantly try to make policies for preventing board burning in terms at the design level, the board burning problem still might not be avoided. Once a board burning phenomenon occurs in a computer room of a customer, the risk brought to the customer is incalculable. This might easily lead to burning or power failure of a single server, affecting the operation of services of the customer. In a severe case, an entire data center will be on fire, causing serious loss to the customer.

The energy required for the board burning is usually enormous. The temperature at a burned position needs to be high enough to cause a PCB material to catch a fire and generate smoke. Only a power network has this condition. Therefore, the board burning problem has always been a key research direction for a board-level power engineer.

In a current server design, the power engineer typically place an E-Fuse (disposable programmable memory) component on the power network to achieve rapid power outage in the event of overcurrent or short circuit in a backend, thereby achieving power off protection and preventing a rapid temperature rise caused by the overcurrent or short circuit in the backend. This ultimately leads to board burning.

However, an actually expected board burning prevention effect has not been achieved. The board burning phenomenon still constantly appears in the computer room of the customer. The fundamental reason is that in case of an abnormality, a backend component or a PCB might not be completely short-circuited, but remains in a low-impedance state for a long time. This state is not sufficient to trigger overcurrent or short circuit protection for the E-Fuse component at a frontend, but it might generate a large amount of heat. As a result, the board burning occurs. For example, an overcurrent protection point of the E-Fuse component on a 12V (volt) power supply unit path is set to a current of 50 A (ampere). If a capacitor at the backend fails, the impedance is 1 ohm (ohm). A current of 12 A may be made through the failed capacitor, but will not trigger the overcurrent protection function of the E-Fuse component. As a result, a large amount of heat will be generated on the failed capacitor, and the board burning occurs.

It might be seen that how to reduce the occurrence of board burning is a problem that needs to be solved by a person skilled in the art.

SUMMARY

The embodiments of the present application aim to provide a mainboard protection system and method, which might reduce the occurrence of board burning.

To solve the above technical problems, according to a first aspect, a mainboard protection system is provided, including a power supply unit, an overcurrent protection component, a voltage regulator a load connected to the voltage regulator, further including a precision resistor arranged between the overcurrent protection component and the voltage regulator; the precision resistor is connected to a current monitoring component; the current monitoring component is connected to a complex programmable logic device; the complex programmable logic device is connected to a processor;

the current monitoring component is configured to transmit, in a case of detecting that a voltage difference of the precision resistor is greater than a set threshold, an early-warning signal to the complex programmable logic device;

the complex programmable logic device is configured to send an interrupt signal to the processor in a case of receiving the early-warning signal; and the processor is configured to cut off outputting of the overcurrent protection component in a case of receiving the interrupt signal sent by the complex programmable logic device.

In some embodiments, a status pin of the current monitoring component is connected to a general-purpose input/output interface of the complex programmable logic device, and is configured to pull down a signal of the status pin in a case of detecting that the voltage difference of the precision resistor is greater than the set threshold; and correspondingly, the complex programmable logic device is configured to send the interrupt signal to the processor in a case of the signal of the status pin is detected as a low-level signal.

In some embodiments, the processor is connected to the current monitoring component through an Inter-Integrated Circuit (I2C) bus, and is configured to: obtain, in a case of receiving the interrupt signal, a signal recorded by a register of the current monitoring component through the 12C bus; determine whether the signal includes the early-warning signal; and cut off the outputting of the overcurrent protection component in a case that the signal includes the early-warning signal.

In some embodiments, the processor is connected to the power supply unit and the overcurrent protection component, and is configured to: detect an output current of the power supply unit and an output current of the overcurrent protection component; and cut off outputting of the power supply unit in a case that a difference value between the output current of the power supply unit and the output current of the overcurrent protection component is greater than a set first threshold.

In some embodiments, the voltage regulator, the precision resistor, and the current monitoring component have a one-to-one correspondence relationship; in a case that there are a plurality of voltage regulators, the processor is configured to: acquire output currents of all the current monitoring components; and in a case that a difference value between an output current of the overcurrent protection component and a sum of the output currents of all the current monitoring components is greater than a set second threshold, cut off the outputting of the overcurrent protection component.

In some embodiments, the complex programmable logic device is connected to the voltage regulator, and is configured to transmit, to the processor in a case of detecting that the voltage regulator is abnormal, a prompt message indicating that the voltage regulator is abnormal; and the processor is configured to cut off the outputting of the overcurrent protection component in a case of receiving the prompt message indicating that the voltage regulator is abnormal.

In some embodiments, the general-purpose input/output interface of the complex programmable logic device is connected to a power good pin of the voltage regulator, and is configured to transmit, to the processor in a case that a power good signal of the power good pin is a low-level signal, a prompt message indicating that the power good signal is a low-level signal.

In some embodiments, in a case that the voltage regulator works normally, the power good signal is at a high level; and in a case that the voltage regulator is abnormal, the outputting of the voltage regulator is cut off, and the power good signal becomes at a low level.

In some embodiments, the processor is connected to the voltage regulator through an I2C bus, and is configured to: in a case that the prompt message indicating that the power good signal is a low-level signal, obtain, through the I2C bus, voltage regulator information recorded in the register of the voltage regulator; and cut off the outputting of the overcurrent protection component after saving the voltage regulator information to a set buffer region.

In some embodiments, the processor is configured to read the voltage regulator information from the set buffer region in a case of receiving a voltage regulator query instruction.

In some embodiments, a human-computer interaction interface is provided on the processor, and the human-computer interaction interface is configured to input the query instruction.

In some embodiments, the processor is configured to: after receiving the prompt message, acquire internal register information of the voltage regulator and save the information, wherein the internal register information is used for locating a cause of a fault of the voltage regulator.

In some embodiments, the mainboard protection system further includes a temperature sensor configured to detect a temperature of the load, wherein the processor is connected to the temperature sensor and is configured to: obtain a temperature value acquired by the temperature sensor; activate a counting function when there is a temperature value exceeding a temperature threshold; add one to a count value in a case that an obtained current temperature value is greater than a previous temperature value; and cut off the outputting of the overcurrent protection component until the count value reaches a set upper limit of count value.

In some embodiments, the processor is configured to: after the counting function is activated, zero the count value in a case that the obtained current temperature value is less than or equal to the previous temperature value.

In some embodiments, the processor is configured to: after the count value is zeroed, deactivate the counting function in a case that the obtained current temperature value is less than or equal to the temperature threshold.

In some embodiments, the processor is configured to: after the counting function is activated, cut off the outputting of the overcurrent protection component in a case that a change rate between the current temperature value and the previous temperature value exceeds a preset change threshold.

In some embodiments, the current monitoring component is connected to the processor and is configured to: in a case of detecting the voltage difference of the precision resistor is greater than the set threshold, transmit the early-warning signal to the complex programmable logic device, and determine whether the voltage difference of the precision resistor is still greater than the set threshold within preset time; and transmit an alert signal to the processor in a case that the voltage difference of the precision resistor is still greater than the set threshold within the preset time; and the processor is configured to cut off the outputting of the overcurrent protection component in a case of receiving the alert signal transmitted by the current monitoring component.

In some embodiments, the processor is a microcontroller unit, or a baseboard management controller.

According to a second aspect, a mainboard protection method is provided, which is applicable to the mainboard protection system described above. The method includes:

determining whether an interrupt signal sent by the complex programmable logic device is received; and cutting off outputting of the overcurrent protection component in a case of receiving the interrupt signal sent by the complex programmable logic device, wherein the interrupt signal is an interrupt signal that is sent by the complex programmable logic device in a case of receiving an early-warning signal that is transmitted by the current monitoring component detecting that a voltage difference of the precision resistor is greater than a set threshold.

In some embodiments, before the cutting off outputting of the overcurrent protection component, the method further includes:

in a case of receiving the interrupt signal, obtaining a signal recorded by a register of the current monitoring component through an I2C bus;

determining whether the signal includes an early-warning signal; and in a case that the signal includes the early-warning signal, executing the step of cutting off outputting of the overcurrent protection component.

In some embodiments, the method further includes:

detecting an output current of the power supply unit and an output current of the overcurrent protection component; and cutting off outputting of the power supply unit in a case that a difference value between the output current of the power supply unit and the output current of the overcurrent protection component is greater than a set first threshold.

In some embodiments, the method further includes:

acquiring output currents of all the current monitoring components; and cutting off the outputting of the overcurrent protection component in a case that a difference value between an output current of the overcurrent protection component and a sum of the output currents of all the current monitoring components is greater than a set second threshold.

In some embodiments, the method further includes:
cutting off the outputting of overcurrent protection components in a case of receiving a prompt message which is transmitted by the complex programmable logic device and indicates that the voltage regulator is abnormal, wherein the prompt message is a message transmitted to the processor in a case that the complex programmable logic device detects an abnormality in the voltage regulator.

In some embodiments, before the cutting off the outputting of the overcurrent protection component in a case of receiving a prompt message which is transmitted by the complex programmable logic device and indicates that the voltage regulator is abnormal, the method further includes:
in a case of receiving the prompt message which is transmitted by the complex programmable logic device and indicates that the voltage regulator is abnormal, obtaining, through the I2C bus, voltage regulator information recorded in the register of the voltage regulator; and after saving the voltage regulator information to a set buffer region, executing the step of cutting off the outputting of the overcurrent protection component.

In some embodiments, after saving the voltage regulator information to the set buffer region, the method further includes:
reading the voltage regulator information from the set buffer region in a case of receiving a voltage regulator query instruction.

In some embodiments, the method further includes:
obtaining a temperature value acquired by the temperature sensor, wherein the temperature sensor is configured to detect a temperature of a load;
activating a counting function when there is a temperature value exceeding a temperature threshold;
adding one to a count value in a case that an obtained current temperature value is greater than a previous temperature value; and
cutting off the outputting of the overcurrent protection component until the count value reaches a set upper limit of count value.

In some embodiments, after the activating a counting function, the method further includes:
zeroing the count value in a case that the obtained current temperature value is less than or equal to the previous temperature value.

In some embodiments, after the zeroing the count value, the method further includes:
deactivating the counting function in a case that the obtained current temperature value is less than or equal to the temperature threshold.

In some embodiments, after the activating a counting function, the method further includes:
cutting off the outputting of the overcurrent protection component in a case that a change rate between the current temperature value and a previous temperature value exceeds a preset change threshold.

In some embodiments, the method further includes:
cutting off the outputting of the overcurrent protection component in a case of receiving the alert signal transmitted by the current monitoring component.

According to a third aspect, a non-volatile computer-readable storage medium is provided, having a computer program stored thereon. The computer program, when run by a processor, implements the steps of the mainboard protection method described above.

According to the above technical solutions, it might be seen that the mainboard protection system includes a power supply unit, an overcurrent protection component, a voltage regulator a load connected to the voltage regulator, further including a precision resistor arranged between the overcurrent protection component and the voltage regulator; the precision resistor is connected to a current monitoring component; the current monitoring component is connected to a complex programmable logic device; and the complex programmable logic device is connected to a processor. In a case of detecting that a voltage difference of the precision resistor is greater than a set threshold, it indicates short circuit or weak short circuit occurs. To avoid board burning caused by a large amount of heat generated in this case, the current monitoring component might transmit an early-warning signal to the complex programmable logic device. The complex programmable logic device sends an interrupt signal to the processor in a case of receiving the early-warning signal. The processor cuts off outputting of the overcurrent protection component in a case of receiving the interrupt signal sent by the complex programmable logic device. Thus, the occurrence of board burning is reduced. In this technical solution, the precision resistor and the current monitoring component are arranged between the overcurrent protection component and the voltage regulator, whereby overcurrent protection for a branch on which each voltage regulator is located might be achieved. Even if a weak short circuit phenomenon occurs at a rear end of the voltage regulator, the branch might be protected more quickly, thereby improving the security of a network system. Compared with the traditional technology for directly using the overcurrent protection component to perform overcurrent protection on the branch where each voltage regulator is located, using the precision resistor and the current monitoring component to monitor the current might achieve a current monitoring function and effectively reduce the design cost. In addition, by use of the interrupt signal transmitted by the complex programmable logic device, all running services of the processor are turned off, whereby all resources of the processor might be used to process a board burning prevention protection mechanism, thereby increasing the protection speed and achieving power outage at the highest speed.

BRIEF DESCRIPTION OF THE DRAWINGS

For clearer descriptions of the embodiments of the present application, the drawings required to be used in the embodiments are briefly introduced below. It is obvious that the drawings in the description below are only some embodiments of the present application, and it is obvious for those skilled in the art that other drawings might be acquired according to the drawings without creative efforts.

DETAILED DESCRIPTION

The technical solutions in embodiments of the present application are clearly and completely described in the following with reference to the accompanying drawings in the embodiments of the present application. Apparently, the described embodiments are merely some rather than all of the embodiments of the present application. All other embodiments obtained by a person of ordinary skill in the art based on the embodiments of the present application without making creative efforts shall fall within the protection scope of the present application.

The terms "include", "has", and any variant of "include" and "has" in the specification and claims of the present application and in the accompanying drawings above are intended to cover a non-exclusive inclusion. For example, a process, method, system, product, or device that includes a series of steps or units is not limited to the listed steps or units, but may include steps or units that are not listed.

To make a person skilled in the art better understand the solutions of the present application, the present application will be in some embodiments explained in detail below in conjunction with the accompanying drawings and optional implementations.

Figure 1:
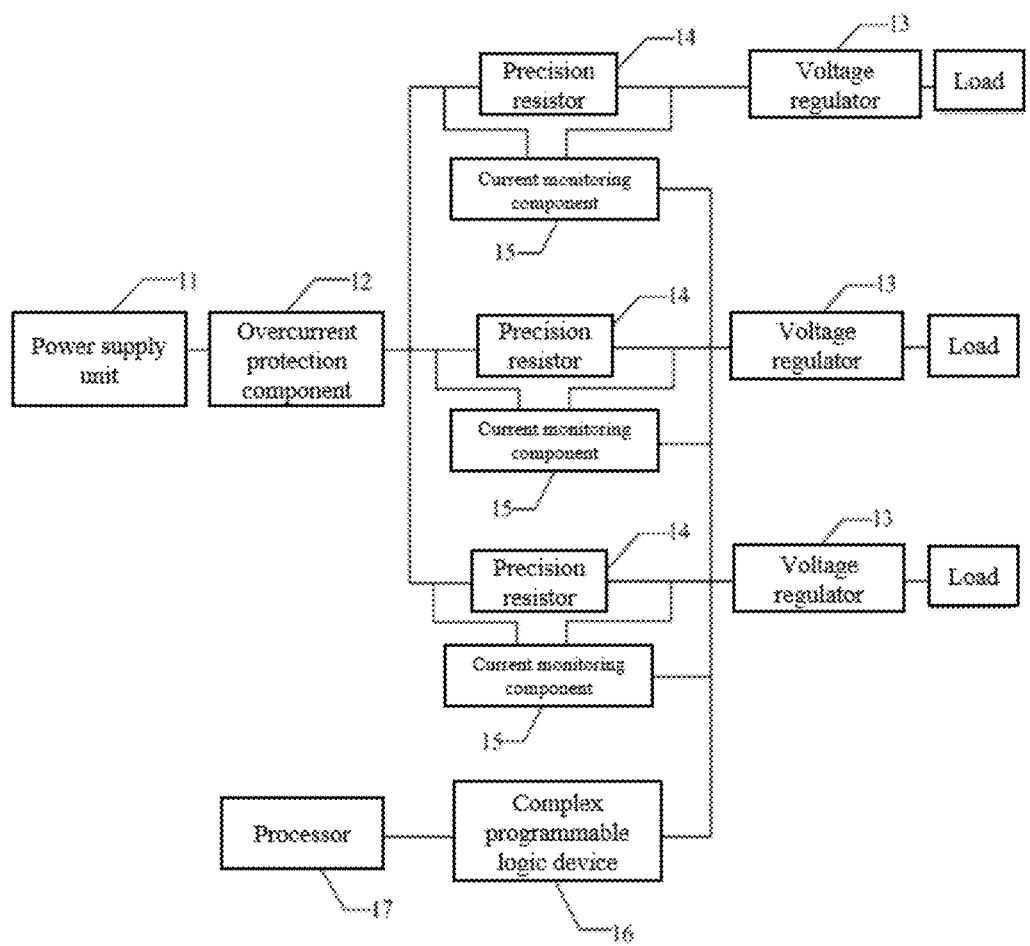
FIG. 1 is a schematic structural diagram of a mainboard protection system according to an embodiment of the present application.

Next, a mainboard protection system according to an embodiment of the present application will be introduced in detail. FIG. 1 is a schematic structural diagram of a mainboard protection system according to an embodiment of the present application. The system includes a power supply unit 11, an overcurrent protection component 12, a voltage regulator 13, and a load connected to the voltage regulator 13, further includes a precision resistor 14 arranged between the overcurrent protection component 12 and the voltage regulator 13. The precision resistor 14 is connected to a current monitoring component 15; the current monitoring component 15 is connected to a complex programmable logic device 16; and the complex programmable logic device 16 is connected to a processor 17.

The mainboard protection system usually includes a plurality of loads. Each load is connected with a corresponding voltage regulator 13. The voltage regulator 13 is configured to provide the load with a voltage required by the load. In this embodiment of the present application, one precision resistor 14 may be mounted between the overcurrent protection component 12 and each voltage regulator 13, and the corresponding current monitoring component 15 is arranged for this precision resistor 14.

In FIG. 1, three loads are taken as an example. Correspondingly, three precision resistors 14 and three current monitoring components 15 might be provided. It should be noted that the three loads in FIG. 1 are for illustrative purposes only. In practical applications, the mainboard protection system may include more or fewer loads, which will not be limited here.

Each current monitoring component 15 is configured to transmit, in a case of detecting that a voltage difference of the precision resistor 14 is greater than a set threshold, an early-warning signal to the complex programmable logic device 16.

Each current monitoring component 15 is responsible for detecting its corresponding precision resistor 14, and each current monitoring component 15 has the same detection mode. In this embodiment of the present application, an introduction is made by taking one current monitoring component 15 as an example.

In a case that the mainboard protection system does not have short circuit or weak short circuit, the voltage difference of the precision resistor 14 shall be equal to or approximate to the set threshold. Once the short circuit or weak short circuit occurs, the voltage difference of the precision resistor 14 will increase. In a case of detecting that the voltage difference of the precision resistor 14 is greater than the set threshold, it indicates the short circuit or weak short circuit occurs. To avoid board burning caused by a large amount of heat generated in this case, the current monitoring component 15 might transmit an early-warning signal to the complex programmable logic device 16.

The complex programmable logic device 16 is configured to send an interrupt signal to the processor 17 in a case of receiving the early-warning signal. The processor 17 is configured to cut off outputting of the overcurrent protection component 12 in a case of receiving the interrupt signal sent by the complex programmable logic device 16.

In practical applications, a status pin of the current monitoring component 15 might be connected to a general-purpose input/output interface of the complex programmable logic device 16. In a case that the current monitoring component 15 detects that the voltage difference of the precision resistor 14 is greater than the set threshold, the current monitoring component 15 might pull down a signal of the status pin. Correspondingly, in a case of detecting that the signal of the status pin is at a low level, the complex programmable logic device 16 sends the interrupt signal to the processor 17.

The status pin might output an Alert signal. The Alert signal is presented in the form of low or high level. In a case that the Alert signal of the current monitoring component 15 is at a high level, it indicates that there is no abnormality in a branch where the precision resistor 14 connected to the current monitoring component 15 is located. In a case that the current monitoring component 15 detects that the voltage difference of the precision resistor 14 is greater than the set threshold, the Alert signal might be lowered. At this time, the Alert signal is at a low level. In a case of detecting that the Alert signal is at the low level, the complex programmable logic device 16 may send the interrupt signal to the processor 17.

In this embodiment of the present application, the processor 17 may use a Microcontroller Unit (MCU) or a Baseboard Management Controller (BMC). For the convenience of introduction, the MCU is taken as an example for illustration.

Figure 2:
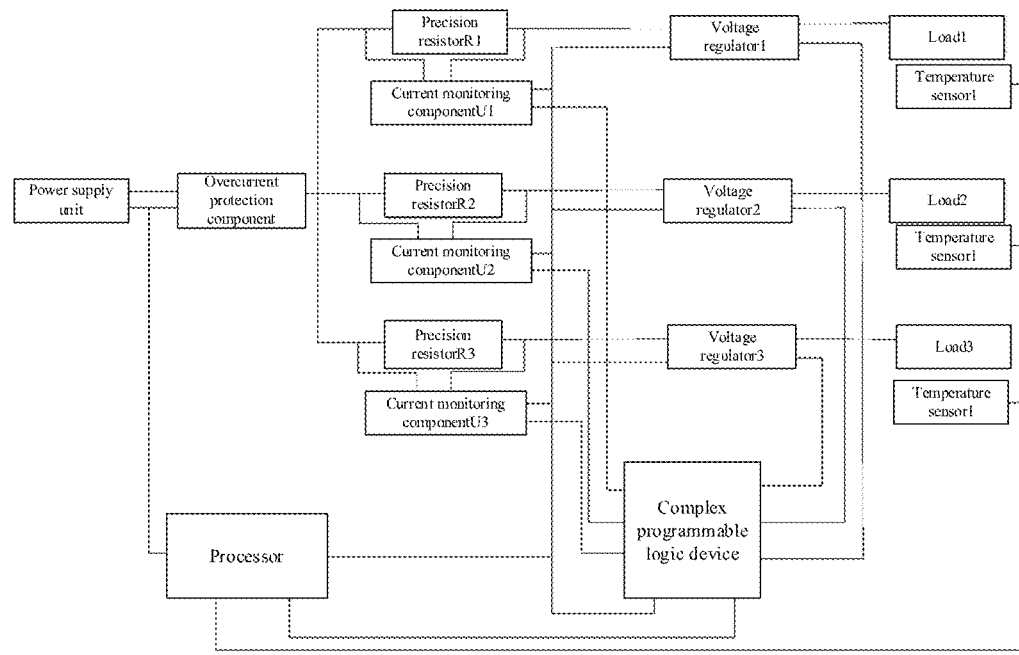
FIG. 2 is a schematic diagram of a circuit connection relationship of a mainboard protection system according to an embodiment of the present application.

FIG. 2 is a schematic diagram of a circuit connection relationship of a mainboard protection system according to an embodiment of the present application. A power supply unit (PSU) outputs power P12V_PSU (12V Power Supply Unit). As an input of an overcurrent protection component (E-Fuse component), the PSU and I2C of the E-Fuse component are connected to the same bus and are jointly connected to I2C0 of the MCU. The output power P12V of the E-Fuse component is divided into three branches, and a precision resistor is placed on each branch to monitor a current on the branch. In FIG. 2, precision resistor R1, precision resistor R2, and precision resistor R3 are taken as an example. Two ends of each precision resistor are connected to a current monitoring component corresponding to the precision resistor. The current monitoring components corresponding to all the precision resistors are current monitoring component U1, current monitoring component U2, and current monitoring component U3. I2Cs of the current monitoring components are connected to an I2C bus of the MCU after being jointly connected to the I2C bus. Alert signals of the current monitoring components are connected to a General-Purpose Input/Output (GPIO) interface of a Complex Programmable Logic Device (CPLD). In FIG. 2, three Voltage Regulators (VRs) are taken as an example. Different digits are added behind the various VRs to distinguish the different VRs, such as voltage regulator 1 (VR1), voltage regulator 2 (VR2), and voltage regulator 3 (VR3). P12V is converted into power P12V_1 as an input of VR1 through precision resistor R1. VR1, VR2, and VR3 are voltage regulators. VR1, VR2, and VR3 might also be referred to as power conversion components. The input 12V voltage can be converted to a voltage grade at which a load might work normally. For example, P12V_1 is converted by VR1 into VOUT1 which is a voltage required by normal working of load 1. VR1, VR2, and VR3 are jointly connected to the I2C2 of the MCU after being connected in parallel. Power Good (PGOOD) signals of VR1, VR2, and VR3 are respectively connected to GPIO pins of the CPLD. Temperature sensor 1, temperature sensor 2, and temperature sensor 3 are respectively placed near load 1, load 2, and load 3, are configured to monitor temperatures of the loads, and are connected to the I2C1 of the MCU through the I2C bus. The GPIO6 of the CPLD is connected to the GPIO pin of the MCU to provide an interrupt signal, and the I2C of the CPLD is connected to the I2C2 of the MCU, too.

In FIG. 2, the CPLD includes pins GPIO0-GPIO6 and pin I2C. Pins GPIO0-GPIO5 are input pins, and the CPLD only receives level states of these pins, instead of controlling them. Pin GPIO6 is an output pin. After receiving Alert from the current monitoring components, that is, after pins GPIO detect that the Alert signals decrease, the CPLD will actively control pin GPIO6 to a low level, so as to trigger the MCU be interrupted. Pin I2C of the CPLD is connected to the I2C2 of the MCU. After receiving the Alert from the current monitoring components, the CPLD may transmit abnormal voltage difference information of the precision resistors to the MCU through the I2C bus.

In practical applications, the MCU might edit a threshold and write it into the current monitoring component 15 through the I2C bus. The current monitoring component 15 acquires the voltage difference between the two ends of the precision resistor 14 in real time and compares the voltage difference with the threshold. When the voltage difference, acquired by the current monitoring component 15, between the two ends of the precision resistor 14 is greater than the threshold, the current monitoring component 15 will pull down the Alert signal. After receiving that the Alert signal is pulled down, pin GPIO of the CPLD triggers a warning mechanism. Pin GPIO6 of the CPLD sends an interrupt signal to the MCU, and the interrupt signal is valid at a low level. After triggering the warning mechanism, the CPLD will pull down the level of pin GPIO6.

According to the above technical solutions, it might be seen that the mainboard protection system includes a power supply unit, an overcurrent protection component, a voltage regulator a load connected to the voltage regulator, further including a precision resistor arranged between the overcurrent protection component and the voltage regulator; the precision resistor is connected to a current monitoring component; the current monitoring component is connected to a complex programmable logic device; and the complex programmable logic device is connected to a processor. In a case of detecting that a voltage difference of the precision resistor is greater than a set threshold, it indicates short circuit or weak short circuit occurs. To avoid board burning caused by a large amount of heat generated in this case, the current monitoring component might transmit an early-warning signal to the complex programmable logic device. The complex programmable logic device sends an interrupt signal to the processor in a case of receiving the early-warning signal. The processor cuts off outputting of the overcurrent protection component in a case of receiving the interrupt signal sent by the complex programmable logic device. Thus, the occurrence of board burning is reduced. In this technical solution, the precision resistor and the current monitoring component are arranged between the overcurrent protection component and the voltage regulator, whereby overcurrent protection for a branch on which each voltage regulator is located might be achieved. Even if a weak short circuit phenomenon occurs at a rear end of the voltage regulator, the branch might be protected more quickly, thereby improving the security of a network system. Compared with the traditional technology for directly using the overcurrent protection component to perform overcurrent protection on the branch where each voltage regulator is located, using the precision resistor and the current monitoring component to monitor the current might achieve a current monitoring function and effectively reduce the design cost. In addition, by use of the interrupt signal transmitted by the complex programmable logic device, all running services of the processor are turned off, whereby all resources of the processor might be used to process a board burning prevention protection mechanism, thereby increasing the protection speed and achieving power outage at the highest speed.

In this embodiment of the present application, to reduce misjudgment and improve the accuracy of a mainboard burning protection operation, the processor 17 might obtain a signal recorded in a register of the corresponding current monitoring component 15 in a case of receiving the interrupt signal sent by the complex programmable logic device 16, thereby ensuring that the current monitoring component 15 indeed detects the abnormal voltage difference of the precision resistor 14, instead that the complex programmable logic device 16 sends the interrupt signal by mistake.

In an optional implementation, the processor 17 might be connected to the current monitoring component 15 through the I2C bus. In a case of receiving the interrupt signal, the processor 17 might obtain the signal recorded in the register of the current monitoring component 15 through the I2C bus to determine whether the signal includes an early-warning signal. In a case that the signal includes the early-warning signal, it indicates that the precision resistor 14 indeed has an abnormal voltage difference, and the processor 17 might cut off the outputting of the overcurrent protection component 12 at this time.

The early-warning signal is used for indicating that the Alert signal is at a low level. In a case that the Alert signal is at a high level, there will be no early-warning signal.

In this embodiment of the present application, the processor 17 might be connected to the power supply unit 11 and the overcurrent protection component 12 respectively, and is configured to achieve security detection on a circuit between the power supply unit 11 and the overcurrent protection component 12.

In an optional implementation, the processor might detect an output current of the power supply unit 11 and an output current of the overcurrent protection component 12; and cut off the outputting of the power supply unit 11 in a case that a difference value between the output current of the power supply unit 11 and the output current of the overcurrent protection component 12 is greater than a set first threshold.

The first threshold might be a small numerical value, which might be preset by management personnel and will not be limited here.

In a case that the circuit does not have short circuit or weak short circuit, the output current of the power supply unit 11 and the output current of the overcurrent protection component 12 shall be equal or approximately equal. Therefore, in a case that the difference value between the output current of the power supply unit 11 and the output current of the overcurrent protection component 12 is greater than the set first threshold, it indicates that there is an abnormality in the circuit between the power supply unit 11 and the overcurrent protection component 12. At this time, the processor 17 might cut off the outputting of the power supply unit 11 to avoid the occurrence of board burning caused by the abnormality in the circuit.

In this embodiment, the processor 17 might perform security detection on a circuit between the overcurrent protection component 12 and the current monitoring component.

The voltage regulator 13, the precision resistor 14, and the current monitoring component 15 have a one-to-one correspondence relationship. In practical applications, there are often a plurality of voltage regulators 13, and correspondingly, there are a plurality of current control components 15 too. In a case that there are a plurality of voltage regulators 13, the processor 17 might acquire the output currents of all the current monitoring components 15; and cut off the outputting of the overcurrent protection component 12 in a case that a difference value between an output current of the overcurrent protection component 12 and a sum of the output currents of all the current monitoring components 15 is greater than a set second threshold.

The second threshold might be a small numerical value, which might be preset by management personnel. The value of the second threshold might be the same or different from the value of the first threshold, which will not be limited here.

In a case that no abnormality occurs in the circuit between the overcurrent protection component 12 and the various current monitoring components 15, the output current of the overcurrent protection component 12 shall be equal or nearly equal to the sum of the output currents of all the current monitoring components 15. Therefore, in a case that the difference value between the output current of the overcurrent protection component 12 and the sum of the output currents of all the current monitoring components 15 is greater than the set second threshold, it indicates that an abnormality occurs in the circuit between the overcurrent protection component 12 and the current monitoring components 15. At this time, the processor 17 might cut off the outputting of the overcurrent protection component 12.

In this embodiment of the present application, the complex programmable logic device 16 might be connected to the various voltage regulators 13 separately, thereby achieving security detection on the voltage regulators 13. The complex programmable logic device 16 might transmit, to the processor 17 in a case of detecting that a voltage regulator 13 is abnormal, a prompt message indicating that a voltage regulator 13 is abnormal. In a case of receiving the prompt message indicating that a voltage regulator 13 is abnormal, the processor 17 cuts off the outputting of the overcurrent protection component 12.

In an optional implementation, a general-purpose input/output interface of the complex programmable logic device 16 might be connected to a power good pin of the voltage regulator 13. The complex programmable logic device 16 transmits, to the processor 17 in a case that a power good signal of the power good pin is a low-level signal, a prompt message indicating that the power good signal is a low-level signal.

The power good pin might output signal PGOOD. Under normal operation of the voltage regulator 13, signal PGOOD is at a high level. In a case of an abnormality in the voltage regulator 13, the outputting of the voltage regulator 13 is cut off, and signal PGOOD will become at a low level at this time.

Each voltage regulator 13 has its corresponding register, and the register records information generated during running of the voltage regulator 13. These pieces of information might provide a basis for fault analysis. To facilitate a fault analyst to perform fault analysis on the voltage regulators 13, in this embodiment of the present application, the processor 17 might be connected to the voltage regulators 13 through the I2C bus. In a case of receiving the prompt message indicating that the power good signal is a low-level signal, the processor 17 might obtain, through the I2C bus, voltage regulator information recorded in the register of the voltage regulator 13; and cut off the outputting of the overcurrent protection component 12 after saving the voltage regulator information to a set buffer region.

In practical applications, when an abnormality occurs in a VR, the outputting of the VR is cut off, and the PGOOD signal of the VR will become at a low level. When the CPLD detects, through the GPIO, that the PGOOD signal of the VR is at the low level, the CPLD will transmit the message to the MCU through the I2C bus. After receiving the message, the MCU may acquire the information of the register in the VR through the I2C bus and save the information. The purpose of acquiring the information of the register is that a fault analyst might later locate the cause of a fault through the information of the register of the VR saved by the MCU. After the saving of the information of the register is completed, the MCU might cut off the outputting of the overcurrent protection component through the I2C bus, thereby completing a power off protection action.

The fault analyst might enter a query instruction for the voltage regulator 13 through a human-computer interaction interface provided by the processor 17. In a case of receiving the query instruction for the voltage regulator 13, the processor 17 might read the information of the voltage regulator 13 from the set buffer region.

In this embodiment of the present application, to achieve the security detection on the loads, a corresponding temperature sensor 18 might be configured for each load. The temperature sensor 18 might be arranged near the load and is configured to detect a temperature of the load.

The processor 17 is connected to the temperature sensor 18 and is configured to: obtain a temperature value acquired by the temperature sensor 18; activate a counting function when there is a temperature value exceeding a temperature threshold; add one to a count value in a case that an obtained current temperature value is greater than a previous temperature value; zero the count value in a case that the obtained current temperature value is less than or equal to the previous temperature value; and cut off the outputting of the overcurrent protection component 12 until the count value reaches a set upper limit of count value.

The value of the upper limit of count value might be set based on an actual need, for example, 10.

By the setting of the upper limit of count value, continuous detection on temperature value changes might be achieved, avoiding misjudgment caused by a single high temperature.

After the count value is zeroed, the processor 17 deactivates the counting function in a case that the obtained current temperature value is less than or equal to the temperature threshold, which indicates that the temperature of the load is not high.

In this embodiment of the present application, in addition to setting the upper limit of count value to monitor the temperature value of the load, after the counting function is activated, a change rate between the current temperature value and the previous temperature value and a preset change threshold might be compared. When the temperature of the load changes dramatically in short time, it is highly likely that there is a fault in a circuit where the load is located. Even if the fault might be recovered in short time, it may cause damage to the load. Therefore, in a case that the change rate between the current temperature value and the previous temperature value exceeds the preset change threshold, the processor 17 might cut off the outputting of overcurrent protection component 12. At this point, the processor 17 might further provide an Alert prompt for load detection, whereby management personnel might timely detect whether the load is damaged, to ensure safe running of the mainboard protection system in the future.

Considering that in practical applications, there may be a situation where the complex programmable logic device 16 is damaged or link transmission between the complex programmable logic device 16 and the current monitoring component 15 fails, causing the complex programmable logic device 16 to fail to find in a timely manner that the Alert signal of the current monitoring component 15 is at a low level and thus fail to transmit an interrupt signal to the processor 17.

Therefore, to improve the security, the current monitoring component 15 might be connected to the processor 17. After transmitting, in a case of detecting that the voltage difference of the precision resistor 14 is greater than the set threshold, the early-warning signal to the complex programmable logic device 16, the current monitoring component 15 determines whether the voltage difference of the precision resistor 14 is still greater than the set threshold within preset time.

A value of the preset time might be set based on an actual need, which will not be limited here.

If the voltage difference of the precision resistor 14 is still greater than the set threshold within the preset time, it indicates that the processor 17 has not cut off the outputting of the overcurrent protection component 12, and there is still current flowing through the precision resistor 14. At this time, the current monitoring component 15 might transmit an alert signal to the processor 17, whereby the processor 17 might cut off the outputting of the overcurrent protection component 12 in a case of receiving the alert signal transmitted by the current monitoring component 15.

Figure 3:
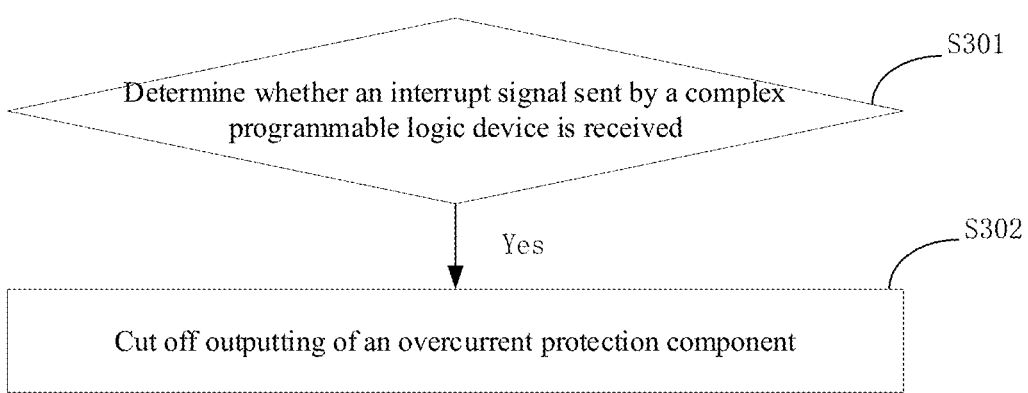
FIG. 3 is a flowchart of a mainboard protection method according to an embodiment of the present application.

FIG. 3 is a flowchart of a mainboard protection method according to an embodiment of the present application, which is applicable to the above mainboard protection system. The method includes:

S301: determining whether an interrupt signal sent by the complex programmable logic device is received.

The processor needs to process many working tasks. To improve the power off processing speed, the complex programmable logic device might be used to detect the current monitoring component. When a voltage difference, acquired by the current monitoring component, between the two ends of the precision resistor is greater than the threshold, the current monitoring component may pull down the Alert signal. After receiving that the Alert signal is pulled down, pin GPIO of the complex programmable logic device triggers a warning mechanism. Pin GPIO6 of the complex programmable logic device sends an interrupt signal to the processor. The interrupt signal is valid at a low level. After triggering the warning mechanism, the complex programmable logic device may pull down the level of pin GPIO6.

S302 is executed after the interrupt signal sent by the complex programmable logic device is received.

S302: cutting off outputting of the overcurrent protection component.

When the processor receives the interrupt signal, it indicates that there is short circuit or weak short circuit in a mainboard. To avoid the occurrence of a board burning phenomenon caused by generation of a large amount of heat in a long-time low-impedance state, the processor might first cut off the outputting of the overcurrent protection component when receiving the interrupt signal sent by the complex programmable logic device, to achieve effective protection on the mainboard by cutting off the transmission of the current on the mainboard.

In this embodiment of the present application, to avoid misoperation and improve the reliability of mainboard protection, register information of the current monitoring component might be obtained to ensure the reliability of the interrupt signal.

Figure 4:
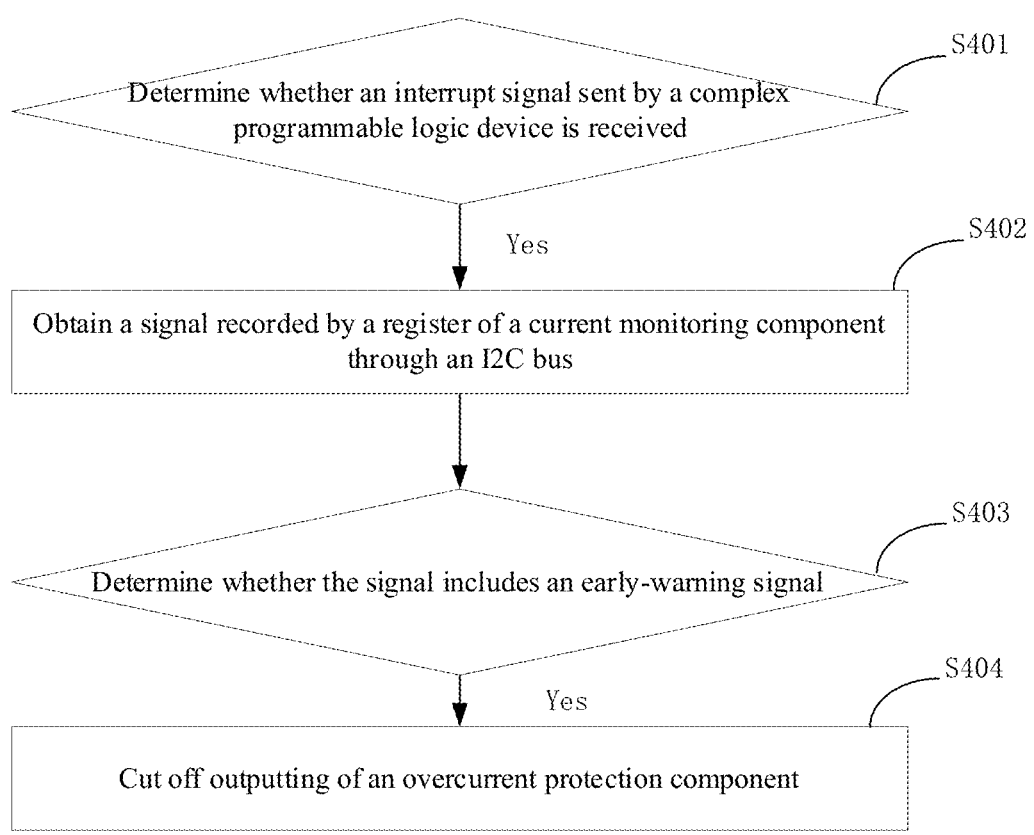
FIG. 4 is a flowchart of a check method for an interrupt signal according to an embodiment of the present application.

FIG. 4 is a flowchart of a check method for an interrupt signal according to an embodiment of the present application. The method includes:

S401: determining whether an interrupt signal sent by the complex programmable logic device is received.

S402 is executed in a case of receiving the interrupt signal.

S402: obtaining a signal recorded by a register of the current monitoring component through an I2C bus.

In practical applications, when the current monitoring component detects that the acquired voltage difference between the two ends of the precision resistor is greater than the threshold, the current monitoring component may pull down the Alert signal, and the register may record the Alert signal as being at a low level. For various operations, the register will record corresponding signals. For ease of distinction, in the embodiments of the present application, the low-level Alert signal might be referred to as an early-warning signal.

S403: determining whether the signal includes the early-warning signal.

In a case that the signal includes the early-warning signal, it indicates that the interrupt signal is consistent with the signal recorded in the register, and it is not possible that the complex programmable logic device triggers the interrupt signal by mistake. At this time, S404 might be executed.

S404: cutting off outputting of the overcurrent protection component.

In practical applications, after the system is powered on, the processor sets a protection threshold for the current monitoring component through the I2C bus. The current monitoring component may set different protection thresholds according to an actual working current of the backend.

The set protection threshold is usually 1.5 times the maximum working current of the branch.

The current monitoring component acquires the voltage difference between the two ends of the precision resistor and compares it with the protection threshold. When the voltage difference between the two ends of the precision resistor is greater than the protection threshold set by the processor, the current monitoring component actively lowers the Alert signal. After detecting the low-level signal, pin GPIO of the complex programmable logic device may send the interrupt signal to the processor through pin GPIO6. After receiving the interrupt signal, the processor accesses a corresponding Alert signal identification register inside the power monitoring component through the I2C bus in order to ensure the accuracy of the interrupt signal and prevent signal interference or false alarm of the complex programmable logic device. If the register indicates that the Alert signal is indeed at the low level, the processor confirms the triggering of the board burning prevention protection mechanism, and the processor cuts off the outputting of the overcurrent protection component through the I2C bus to complete a power off protection action.

In this embodiment of the present application, in a case that the processor obtains the interrupt signal, the reliability of the interrupt signal might be ensured by querying the signal recorded in the register of the current monitoring component, thereby avoiding accidental power outage of the mainboard caused by erroneous triggering of the interrupt signals by the complex programmable logic device.

Figure 5:
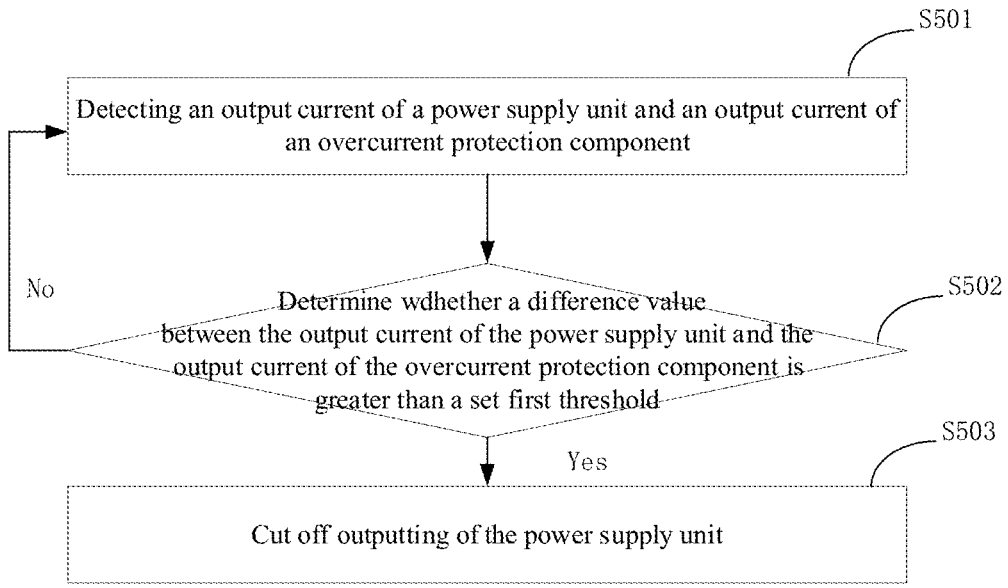
FIG. 5 is a flowchart of a method for security detection between a power supply unit and an overcurrent protection component according to an embodiment of the present application.

FIG. 5 is a flowchart of a method for security detection between a power supply unit and an overcurrent protection component according to an embodiment of the present application. The method includes:

S501: detecting an output current of the power supply unit and an output current of the overcurrent protection component.

S502: determining whether a difference value between the output current of the power supply unit and the output current of the overcurrent protection component is greater than a set first threshold.

In a case that the difference value between the output current of the power supply and the output current of the overcurrent protection component is greater than the set first threshold, it indicates that there is an abnormality occurring in a circuit between the power supply unit and the overcurrent protection component. At this time, S503 might be executed.

In a case that the difference value between the output current of the power supply unit and the output current of the overcurrent protection component is not greater than the set first threshold, it indicates that there is currently no abnormality in the circuit between the power supply unit and the overcurrent protection component. At this time, S501 might be executed to continue to detect the output currents of both the power supply unit and the overcurrent protection component.

S503: cutting off the outputting of the power supply unit.

In practical applications, after the system is powered on, the processor might acquirer the output current values of both the power supply unit and the overcurrent protection component through the I2C bus, and subtract the two acquired currents. The processor sets a current protection threshold internally on a printed circuit board (PCB) path between the power supply unit and the overcurrent protection component. For ease of distinguishing different thresholds, the current protection threshold might be referred to as a first threshold.

When the difference obtained by subtracting the output current value of the power supply unit by the output current value of the overcurrent protection component is greater than the first threshold set internally by the processor, board burning prevention control is triggered. At this time, the processor determines that an abnormality has occurred and cuts off the outputting of the power supply unit through the I2C bus, thereby completing a power off protection function.

Figure 6:
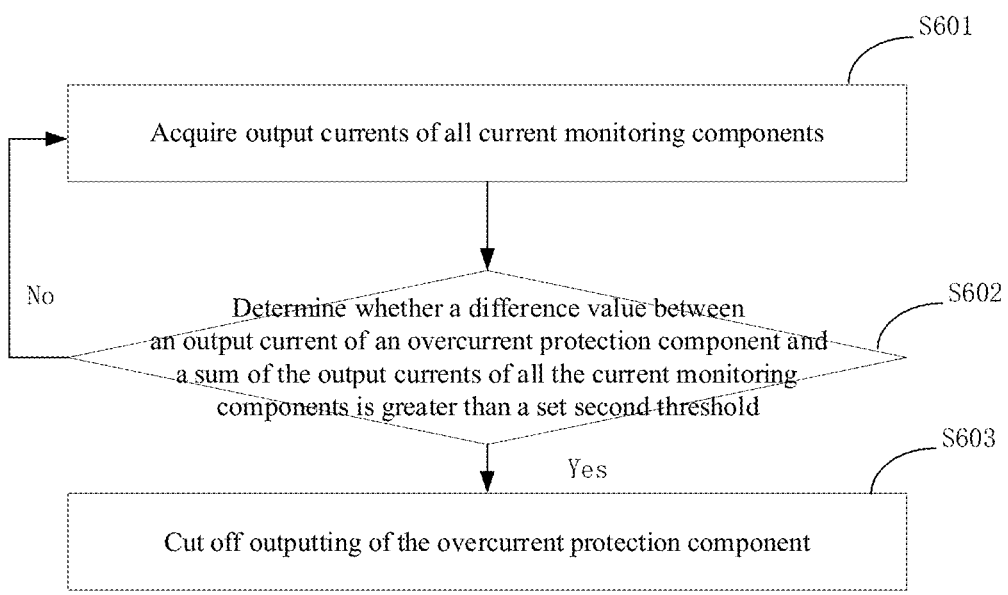
FIG. 6 is a flowchart of a method for security detection between an overcurrent protection component and a current monitoring component according to an embodiment of the present application.

FIG. 6 is a flowchart of a method for security detection between an overcurrent protection component and a current monitoring component according to an embodiment of the present application. The method includes:

S601: acquiring output currents of all the current monitoring components.

There are often a plurality of current monitoring components. The processor might be connected to each current monitoring component separately through the I2C bus, so as to acquire the output currents of all the current monitoring components.

S602: determining whether a difference value between an output current of the overcurrent protection component and a sum of the output currents of all the current monitoring components is greater than a set second threshold.

In a case that the difference value between the output current of the overcurrent protection component and the sum of the output currents of all the current monitoring components is greater than the set second threshold, it indicates that an abnormality occurs in a circuit between the overcurrent protection component and the current monitoring components. At this time, S603 might be executed.

In a case that the difference value between the output current of the overcurrent protection component and the sum of the output currents of all the current monitoring components is not greater than the set second threshold, it indicates that no abnormality occurs in the circuit between the overcurrent protection component and the current monitoring components. At this time, S601 might be executed to continue to acquire the output currents of all the current monitoring components.

S603: cutting off outputting of the overcurrent protection component.

In practical applications, after the system is powered on, the processor might acquire the current values of all the current monitoring components through the I2C bus, and performs addition processing on the acquired currents. The processor synchronously acquires the output current of the overcurrent protection component through the I2C bus, and performs subtraction on the acquired output current of the overcurrent protection component and the sum of the acquired output currents of the current monitoring components. The processor sets a current protection threshold internally on a PCB path between the overcurrent protection component and the precision resistor. For ease of distinguishing different thresholds, the current protection threshold might be referred to as a second threshold.

When the difference obtained by subtracting the output current of the overcurrent protection component by the sum of the current values of the current monitoring components is greater than the set second threshold, the processor determines that an abnormality has occurred, and the processor cuts off the outputting of the overcurrent protection component through the I2C bus, thereby completing a power off protection action.

Figure 7:
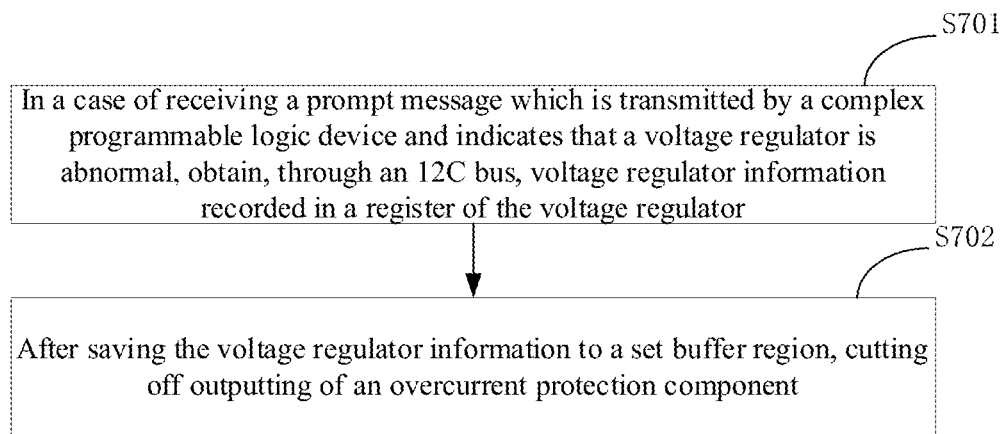
FIG. 7 is a flowchart of a method for security detection of a voltage regulator according to an embodiment of the present application.

FIG. 7 is a flowchart of a method for security detection of a voltage regulator according to an embodiment of the present application. The method includes:

S701: in a case of receiving a prompt message which is transmitted by the complex programmable logic device and indicates that the voltage regulator is abnormal, obtaining, through the I2C bus, voltage regulator information recorded in the register of the voltage regulator.

S702: after saving the voltage regulator information to a set buffer region, cutting off the outputting of the overcurrent protection component.

The prompt message is a message that is transmitted by the complex programmable logic device to the processor in a case that the complex programmable logic device detects that the voltage regulator is abnormal.

In the embodiments of the present application, the fault analyst might enter a query instruction for the voltage regulator through a human-computer interaction interface provided by the processor. In a case of receiving the query instruction for the voltage regulator, the processor might read the voltage regulator information from the set buffer region.

In practical applications, in a case that the processor receives the prompt message indicating that the voltage regulator is abnormal, the processor might acquire the information of the register in the voltage regulator through the I2C bus and save this information. The purpose of this action is that the fault analyst might later locate the cause of the fault through the information of the register of the voltage regulator saved by the processor. After the saving of the information of the register is completed, the processor might cut off the outputting of the overcurrent protection component through the I2C bus, thereby completing a power off protection action.

Figure 8:
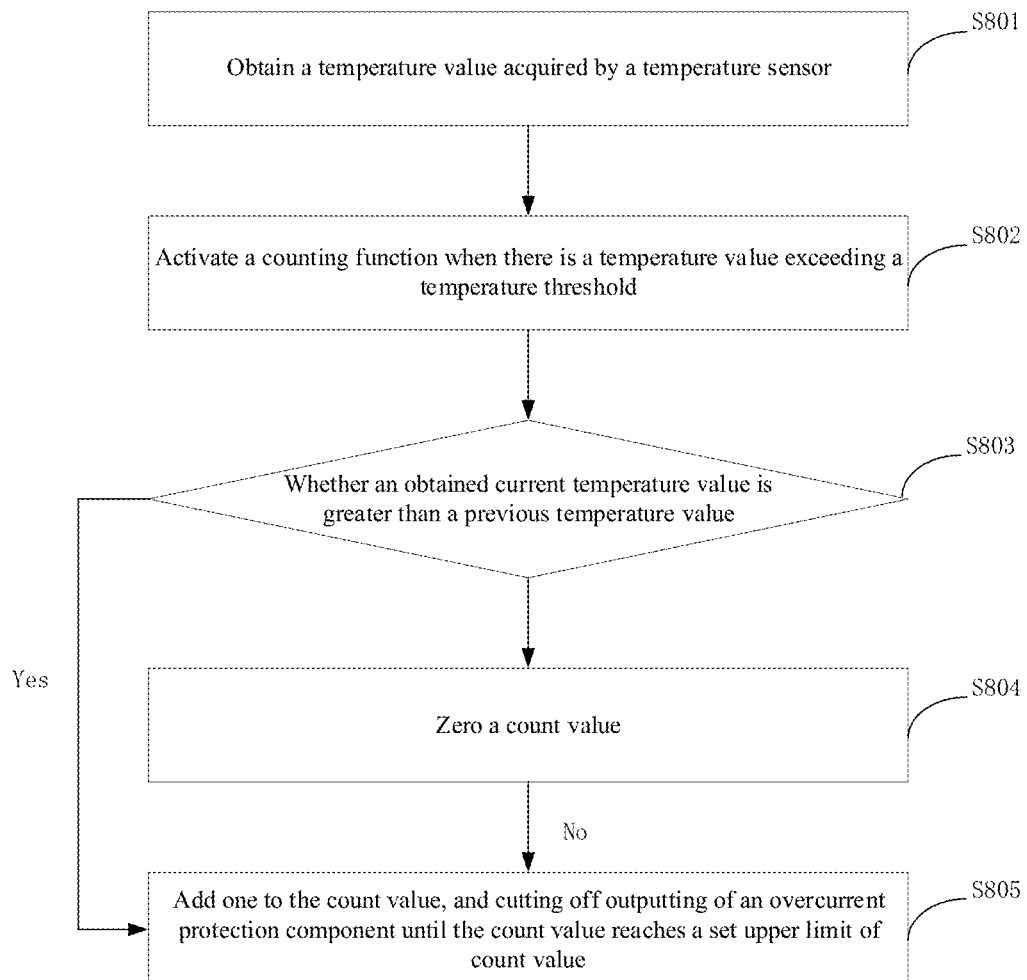
FIG. 8 is a flowchart of a method for security detection of a load according to an embodiment of the present application.

FIG. 8 is a flowchart of a method for security detection of a load according to an embodiment of the present application. The method includes:

S801: obtaining a temperature value acquired by the temperature sensor.

The temperature sensor is configured to detect a temperature of a load.

S802: activating a counting function in a case that there is a temperature value exceeding a temperature threshold.

S803: determining whether an obtained current temperature value is greater than a previous temperature value.

When the obtained current temperature value is greater than the previous temperature value, it indicates that the temperature rises constantly. S805 might be executed at this time.

When the obtained current temperature value is less than or equal to the previous temperature value, it indicates that the temperature tends to decrease. S804 might be executed at this time.

S804: zeroing a count value.

S805: adding one to the count value, and cutting off the outputting of the overcurrent protection component until the count value reaches a set upper limit of count value.

When the count value reaches the set upper limit of count value, it indicates that the temperature of the load has been continuously increasing for a period of time. At this time, to avoid board burning, the processor might cut off the outputting of the overcurrent protection component.

In a case that the obtained current temperature value is less than or equal to the temperature threshold, it indicates that the temperature of the load has decreased to a safe range, the processor might deactivate the counting function at this time.

In practical applications, after the system is powered on, the processor captures temperature information inside the voltage regulator and the temperature sensor through the I2C bus, and sets the over temperature protection threshold internally. The processor compares the acquired temperature information with the internally set over temperature protection threshold. When the temperatures of the voltage regulator and the temperature sensor are greater than the internally set over temperature protection threshold, the processor starts to count. If the temperature captured by the processor each time in the subsequent 10 temperature data captures is greater than the previous data, the processor determines that an abnormality has occurred, and the processor cuts off the outputting of the overcurrent protection component through the I2C bus, thereby completing a power off protection action. If one of temperatures continuously captured 10 times is lower than the previous captured temperature, the processor recounts until the temperature is less than the protection threshold. The purpose of this operation is to prevent accidental power outage of the system caused by incorrect captured temperature information.

In this embodiment of the present application, in addition to setting the upper limit of count value to monitor the temperature value of the load, after the counting function is activated, a change rate between the current temperature value and the previous temperature value and a preset change threshold might be compared. In a case that the temperature of the load changes dramatically in short time, it is highly likely that there is a fault in a circuit where the load is located. Even if the fault might be recovered in short time, it may cause damage to the load. Therefore, in a case that the change rate between the current temperature value and the previous temperature value exceeds the preset change threshold, the processor might cut off the outputting of overcurrent protection component.

The processes from FIG. 3 to FIG. 8 achieves multiple stages of protection mechanisms for the mainboard system, thereby effectively protecting all links from the output of the power supply unit to the terminal load. Any abnormality that triggers one of the protection mechanisms might trigger the power outage action of the system, thereby achieving comprehensive protection and improving the security of the system. Meanwhile, to ensure the authenticity and validity of the protection action, an anti-triggering mechanism is provided to avoid misoperations and improve the reliability of the power off protection.

According to the above technical solutions, it might be seen that the mainboard protection system includes a power supply unit, an overcurrent protection component, a voltage regulator a load connected to the voltage regulator, further including a precision resistor arranged between the overcurrent protection component and the voltage regulator; the precision resistor is connected to a current monitoring component; the current monitoring component is connected to a complex programmable logic device; and the complex programmable logic device is connected to a processor. In a case of detecting that a voltage difference of the precision resistor is greater than a set threshold, it indicates short circuit or weak short circuit occurs. To avoid board burning caused by a large amount of heat generated in this case, the current monitoring component might transmit an early-warning signal to the complex programmable logic device. The complex programmable logic device sends an interrupt signal to the processor in a case of receiving the early-warning signal. The processor cuts off outputting of the overcurrent protection component in a case of receiving the interrupt signal sent by the complex programmable logic device. Thus, the occurrence of board burning is reduced. In this technical solution, the precision resistor and the current monitoring component are arranged between the overcurrent protection component and the voltage regulator, whereby overcurrent protection for a branch on which each voltage regulator is located might be achieved. Even if a weak short circuit phenomenon occurs at a rear end of the voltage regulator, the branch might be protected more quickly, thereby improving the security of a network system. Compared with the traditional technology for directly using the overcurrent protection component to perform overcurrent protection on the branch where each voltage regulator is located, using the precision resistor and the current monitoring component to monitor the current might achieve a current monitoring function and effectively reduce the design cost. In addition, by use of the interrupt signal transmitted by the complex programmable logic device, all running services of the processor are turned off, whereby all resources of the processor might be used to process a board burning prevention protection mechanism, thereby increasing the protection speed and achieving power outage at the highest speed.

It should be understood that if the mainboard protection method in the embodiments of the present application are implemented in a form of a software functional unit and sold or used as a stand-alone product, the mainboard protection method may be stored in a non-volatile computer-readable storage medium. Based on this understanding, the technical solutions of the present application essentially, or the part that contributes to the prior art, or all or some of the technical solutions, might be reflected in the form of a software product. The computer software product is stored in a non-volatile readable storage medium to execute all or some of the steps of the methods in the embodiments of the present application. The aforementioned non-volatile readable storage medium includes: a USB flash disk, a portable hard disk drive, a Read-Only Memory (ROM), a Random Access Memory (RAM), an electrically erasable programmable ROM, a register, a hard disk drive, a removable magnetic disk, a Compact disc ROM (CD-ROM), a magnetic tape or an optical disc, and other media that might store program codes.

Based on this, the embodiments of the present application further provide a non-volatile computer-readable storage medium, having a computer program stored thereon. The computer program, when run by a processor, implements the steps of the mainboard protection method described above.

The above provides a detailed introduction to the mainboard protection system and method provided by the embodiments of the present application. The embodiments of the present application in this specification are described in a progressive manner, and each embodiment focuses on differences from other embodiments. The same or similar parts between the embodiments of the present application might be referred to each other. Since the apparatus disclosed in the embodiments correspond to the method disclosed in the embodiments, the apparatus is described simply, and related parts are found in some of the explanations of the method.

A person skilled in the art may realize that units and algorithm steps of all the examples described in the foregoing embodiments disclosed herein may be implemented by electronic hardware, computer software, or a combination thereof. To clearly describe the interchangeability between the hardware and the software, the foregoing has generally described compositions and steps of each example based on functions. Whether these functions are implemented as hardware or software depends on particular application and design constraint conditions of the technical solutions. A person skilled in the art may use different methods to implement the described functions for each particular application, but it should not be considered that the implementation goes beyond the scope of the present application.

The above provides a detailed introduction to the mainboard protection system and method provided by the present application. The principles and implementations of the present application are explained herein with optional examples, and the explanations of the embodiments of the present application are only used to help understand the method of the present application and a core idea of the method. It should be pointed out that a person of ordinary skill in the art might also make several improvements and modifications to the present application without departing from the principles of the present application, and these improvements and modifications also fall within the scope of protection of the claims of the present application.

What is claimed is:

1. A mainboard protection system, comprising a power supply unit, an overcurrent protection component, a voltage regulator, and a load connected to the voltage regulator, further comprising a precision resistor arranged between the overcurrent protection component and the voltage regulator, wherein the precision resistor is connected to a current monitoring component; the current monitoring component is connected to a complex programmable logic device; the complex programmable logic device is connected to a processor;

the current monitoring component is configured to transmit, in response to detecting that a voltage difference of the precision resistor is greater than a set threshold, an early-warning signal to the complex programmable logic device;

the complex programmable logic device is configured to send an interrupt signal to the processor in response to receiving the early-warning signal; and the processor is configured to cut off outputting of the overcurrent protection component in response to receiving the interrupt signal sent by the complex programmable logic device.

2. The mainboard protection system according to claim 1, wherein a status pin of the current monitoring component is connected to a general-purpose input/output interface of the complex programmable logic device, and is configured to pull down a signal of the status pin in response to detecting that the voltage difference of the precision resistor is greater than the set threshold; and correspondingly, the complex programmable logic device is configured to send the interrupt signal to the processor in a case of in response to the signal of the status pin is detected as a low-level signal.

3. The mainboard protection system according to claim 1, wherein the processor is connected to the current monitoring component through an Inter-Integrated Circuit (I2C) bus, and is configured to: obtain, in response to receiving the interrupt signal, a signal recorded by a register of the current monitoring component through the 12C bus; determine whether the signal comprises the early-warning signal; and cut off the outputting of the overcurrent protection component in a case that the signal includes the early-warning signal.

4. The mainboard protection system according to claim 1, wherein the processor is connected to the power supply unit and the overcurrent protection component, and is configured to: detect an output current of the power supply unit and an output current of the overcurrent protection component; and cut off outputting of the power supply unit in a case that a difference value between the output current of the power supply unit and the output current of the overcurrent protection component is greater than a set first threshold.

5. The mainboard protection system according to claim 1, wherein the voltage regulator, the precision resistor, and the current monitoring component have a one-to-one correspondence relationship; in a case that there are a plurality of voltage regulators, the processor is configured to: acquire output currents of all the current monitoring components; and cut off the outputting of the overcurrent protection component in a case that a difference value between an output current of the overcurrent protection component and a sum of the output currents of all the current monitoring components is greater than a set second threshold.

6. The mainboard protection system according to claim 1, wherein the complex programmable logic device is connected to the voltage regulator, and is configured to transmit, to the processor in response to detecting that the voltage regulator is abnormal, a prompt message indicating that the voltage regulator is abnormal; and the processor is configured to cut off the outputting of the overcurrent protection component in response to receiving the prompt message indicating that the voltage regulator is abnormal.

7. The mainboard protection system according to claim 6, wherein a general-purpose input/output interface of the complex programmable logic device is connected to a power good pin of the voltage regulator, and is configured to transmit, to the processor in a case that a power good signal of the power good pin is a low-level signal, a prompt message indicating that the power good signal is a low-level signal.

8. The mainboard protection system according to claim 7, wherein in a case that the voltage regulator works normally, the power good signal is at a high level; and in a case that the voltage regulator is abnormal, outputting of the voltage regulator is cut off, and the power good signal becomes at a low level.

9. The mainboard protection system according to claim 7, wherein the processor is connected to the voltage regulator through an I2C bus, and is configured to: in a case that the prompt message indicating that the power good signal is a low-level signal, obtain, through the I2C bus, voltage regulator information recorded in a register of the voltage regulator; and cut off the outputting of the overcurrent protection component after saving the voltage regulator information to a set buffer region.

10. The mainboard protection system according to claim 9, wherein the processor is configured to read the voltage regulator information from the set buffer region in response to receiving a voltage regulator query instruction.

11. The mainboard protection system according to claim 10, wherein a human-computer interaction interface is provided on the processor, and the human-computer interaction interface is configured to input the query instruction.

12. The mainboard protection system according to claim 10, wherein the processor is configured to: after receiving the prompt message, acquire internal register information of the voltage regulator and save the information, wherein the internal register information is used for locating a cause of a fault of the voltage regulator.

13. The mainboard protection system according to claim 1, further comprising a temperature sensor configured to detect a temperature of the load, wherein the processor is connected to the temperature sensor and is configured to: obtain a temperature value acquired by the temperature sensor; activate a counting function when there is a temperature value exceeding a temperature threshold; add one to a count value in a case that an obtained current temperature value is greater than a previous temperature value; and cut off the outputting of the overcurrent protection component until the count value reaches a set upper limit of count value.

14. The mainboard protection system according to claim 13, wherein the processor is configured to: after the counting function is activated, zero the count value in a case that the obtained current temperature value is less than or equal to the previous temperature value.

15. The mainboard protection system according to claim 13, wherein the processor is configured to: after the count value is zeroed, deactivate the counting function in a case that the obtained current temperature value is less than or equal to the temperature threshold.

16. The mainboard protection system according to claim 13, wherein the processor is configured to: after the counting function is activated, cut off the outputting of the overcurrent protection component in a case that a change rate between the current temperature value and the previous temperature value exceeds a preset change threshold.

17. The mainboard protection system according to claim 1, wherein the current monitoring component is connected to the processor and is configured to: transmit the early-warning signal to the complex programmable logic device in in response to detecting the voltage difference of the precision resistor is greater than the set threshold, and determine whether the voltage difference of the precision resistor is still greater than the set threshold within preset time; and transmit an alert signal to the processor in a case that the voltage difference of the precision resistor is still greater than the set threshold within the preset time; and the processor is configured to cut off the outputting of the overcurrent protection component in response to receiving the alert signal transmitted by the current monitoring component.

18. The mainboard protection system according to claim 1, wherein the processor is a microcontroller unit.

19. The mainboard protection system according to claim 1, wherein the processor is a baseboard management controller.

20. A mainboard protection method, being applicable to a mainboard protection system, comprising a power supply unit, an overcurrent protection component, a voltage regulator, and a load connected to the voltage regulator, further comprising a precision resistor arranged between the overcurrent protection component and the voltage regulator, wherein the precision resistor is connected to a current monitoring component; the current monitoring component is connected to a complex programmable logic device; the complex programmable logic device is connected to a processor;

the current monitoring component is configured to transmit, in response to detecting that a voltage difference of the precision resistor is greater than a set threshold, an early-warning signal to the complex programmable logic device;

the complex programmable logic device is configured to send an interrupt signal to the processor in response to receiving the early-warning signal; and the processor is configured to cut off outputting of the overcurrent protection component in response to receiving the interrupt signal sent by the complex programmable logic device; and wherein the method comprising:
determining whether an interrupt signal sent by the complex programmable logic device is received; and
cutting off outputting of the overcurrent protection component in response to receiving the interrupt signal sent by the complex programmable logic device, wherein the interrupt signal is an interrupt signal that is sent by the complex programmable logic device in response to receiving an early-warning signal that is transmitted by the current monitoring component detecting that a voltage difference of the precision resistor is greater than a set threshold.

\* \* \* \* \*